(12) United States Patent  
Schremmer

(10) Patent No.: US 7,082,037 B2  
(45) Date of Patent: Jul. 25, 2006

(54) PC CARD HOUSING

(75) Inventor: Andreas Michael Schremmer, Berglen (DE)

(73) Assignee: ITT Manufacturing Enterprises, Inc, Wilmington, DE (US)

( * ) Notice: Subject to any disclaimer, the term of this patent is extended or adjusted under 35 U.S.C. 154(b) by 241 days.

(21) Appl. No.: 10/680,480

(22) Filed: Oct. 6, 2003

(65) Prior Publication Data

US 2004/0070962 A1   Apr. 15, 2004

(30) Foreign Application Priority Data

Oct. 9, 2002   (DE)   ................................ 102 48 119

(51) Int. Cl.
*H05K 1/14* (2006.01)

(52) U.S. Cl. ...................... 361/737; 361/801; 361/818; 174/35 R; 174/51

(58) Field of Classification Search ................ 361/737, 361/752, 790, 800, 797, 801–802, 816, 818; 174/35 R, 51

See application file for complete search history.

(56) References Cited

U.S. PATENT DOCUMENTS 5,038,250 A * 8/1991 Uenaka et al. .............. 361/737  
6,166,913 A   12/2000 Fun et al.  
6,324,076 B1 * 11/2001 Gerrits et al. ............... 361/818

* cited by examiner

*Primary Examiner*—Kamand Cuneo  
*Assistant Examiner*—Hung S. Bui  
(74) *Attorney, Agent, or Firm*—Peter Van Winkle

(57) ABSTRACT

A sheet metal cover (11) for a PC card, or electronic card, includes identical top and bottom sheet metal cover parts (13, 12) with opposite sides constructed to allow the cover parts to be joined together by merely pushing the sides of the top cover part forcefully down against the sides of the bottom cover part. One side (23) of each cover part is bent and cut to form a plurality of latching lugs (37), and the other side (24) of each cover part is bent and cut to form a plurality of slots leading to recesses that each receives a lug and then resists movement of the lug out of the recess. Each lug has outer and inner legs (38, 39) that are joined in a fold of less than 90°. The slots each receives a lug only when the inner and outer legs of the lug are deflected closer together.

4 Claims, 8 Drawing Sheets

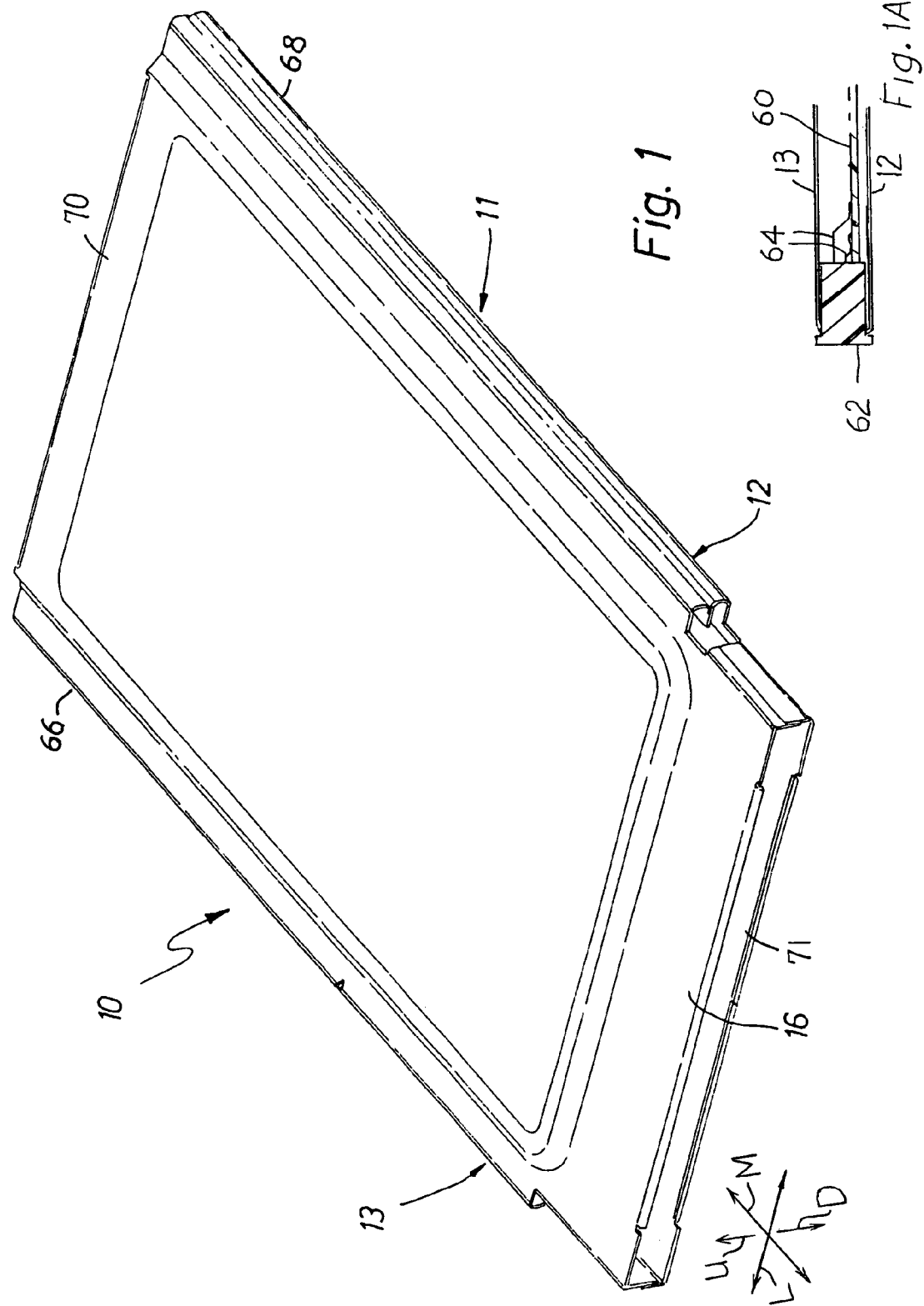

PC CARD HOUSING

CROSS-REFERENCE

Applicant claims priority from German application 10248119.9 filed 9 Oct. 2002.

BACKGROUND OF THE INVENTION

A PC card, often referred to as a plug-in card or electronic card, has a circuit board and has a sheet metal housing, or cover, that surrounds a majority of the circuit board. The cover includes top and bottom sheet metal cover parts that each has a primarily flat, horizontal major portion and that has laterally opposite sides that are joined together. It would be desirable if the cover parts could be joined together in a simple manner, as by merely pressing them together while the circuit board lay between them.

SUMMARY OF THE INVENTION

In accordance with one embodiment of the present invention, an electronic card is provided of the type that has a circuit board surrounded by a sheet metal cover, wherein the cover has top and bottom cover parts that can be readily joined together by merely pressing the sides of one down against the sides of the other. A first side of the top cover part has a plurality of longitudinally-spaced latching lugs. A corresponding first side of the bottom cover part has a plurality of slots leading to lug-receiving recesses with walls constructed to engage a lug moved down into a recess and resist its upward movement out of the recess.

The first side of the bottom cover part includes an inwardly-extending horizontal slot wall at the top of a vertical sidewall, forming the lug-receiving slots. Each lug includes outer and inner legs and a fold that joins the legs. Each slot has a width that requires the inner and outer legs of a lug to deflect closer together in order to pass down through the slot. In one lug construction, the inner leg has a free upper end that snaps under the slot-forming wall and thereafter prevents the lug from moving upward out of the recess.

The novel features of the invention are set forth with particularity in the appended claims. The invention will be best understood from the following description when read in conjunction with the accompanying drawings.

BRIEF DESCRIPTION OF THE DRAWINGS

FIG. 1 is a top isometric view of a sheet metal cover of an electronic card of the present invention.

FIG. 1A is a partial side sectional view of an electronic card that includes the cover of FIG. 1.

DESCRIPTION OF THE PREFERRED EMBODIMENTS

Figure 2A:
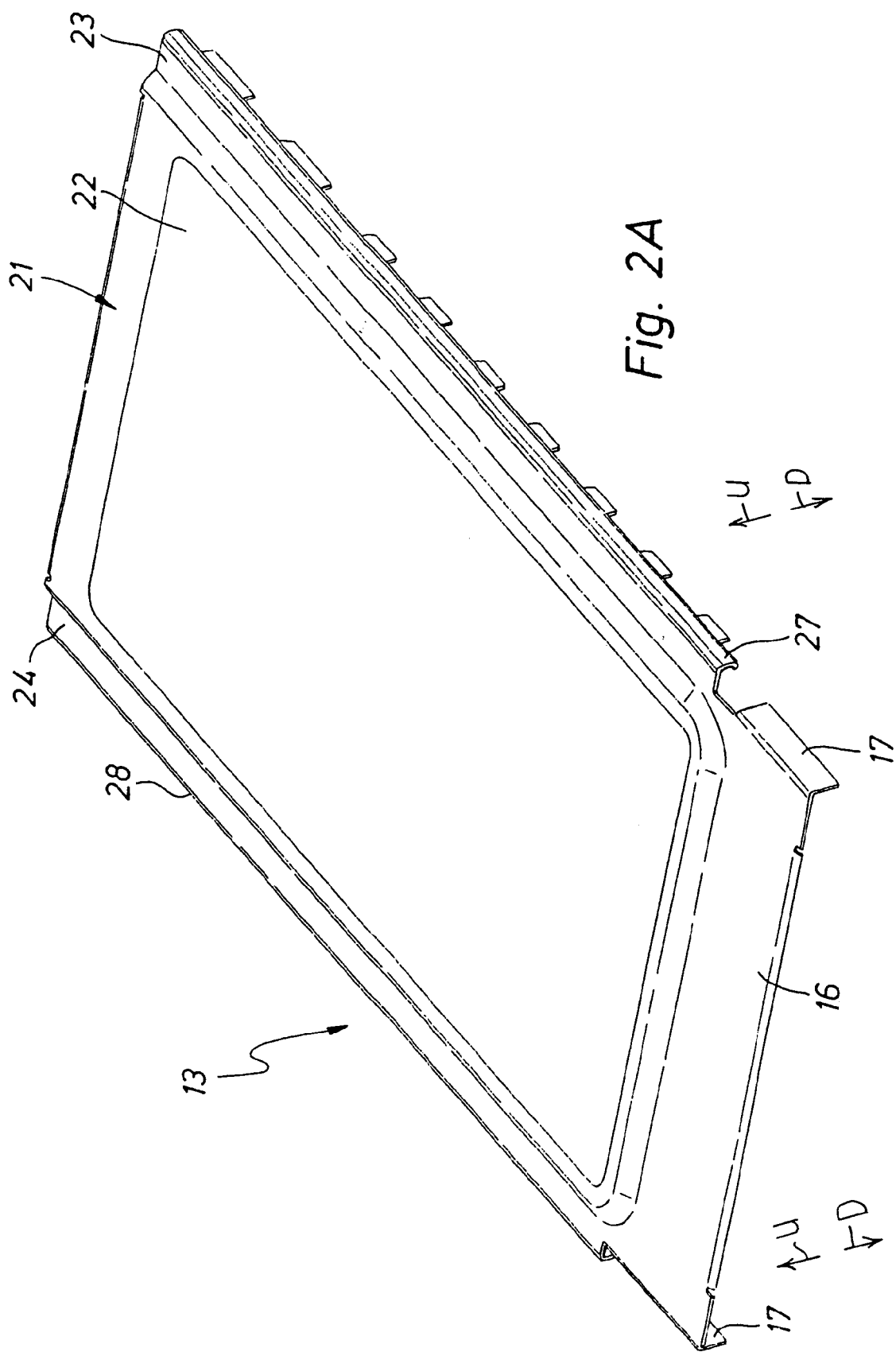
FIG. 2A is a top isometric view of one of the cover parts of the cover of FIG. 1.

FIG. 1 illustrates an electronic card 10, sometimes referred to as a PC card or plug-in card, with only the housing or cover 11 being shown. As also shown in the FIG. 1A, the electronic card includes a circuit board 60 and a front connector 62 having contacts with tails 64 connected to conductive traces on the circuit board. The cover includes bottom and top cover parts 12, 13 that lie respectively above and below most of the circuit board. The electronic card 10 of FIG. 1 has laterally L opposite sides 66, 68 and longitudinally M opposite ends 70, 71. The bottom and top cover parts lie respectively downward D and upward U of the circuit board.

The bottom and top cover parts 12, 13 are identical in the particular electronic card illustrated. As shown in FIG. 2A, each stainless steel sheet metal cover part such as the top part 13, includes a flat base 21 which lies primarily in a horizontal plane, that is, the base lies normal to the up and down directions U and D. Actually, the base generally includes a flat central region 22, flat side regions 23, 24 and a flat end region 16 which lie slightly lower than the central region. The cover part has opposite sides 27, 28 that extend below the side regions. End walls 17 lie at the front end of the cover.

Figure 2B:
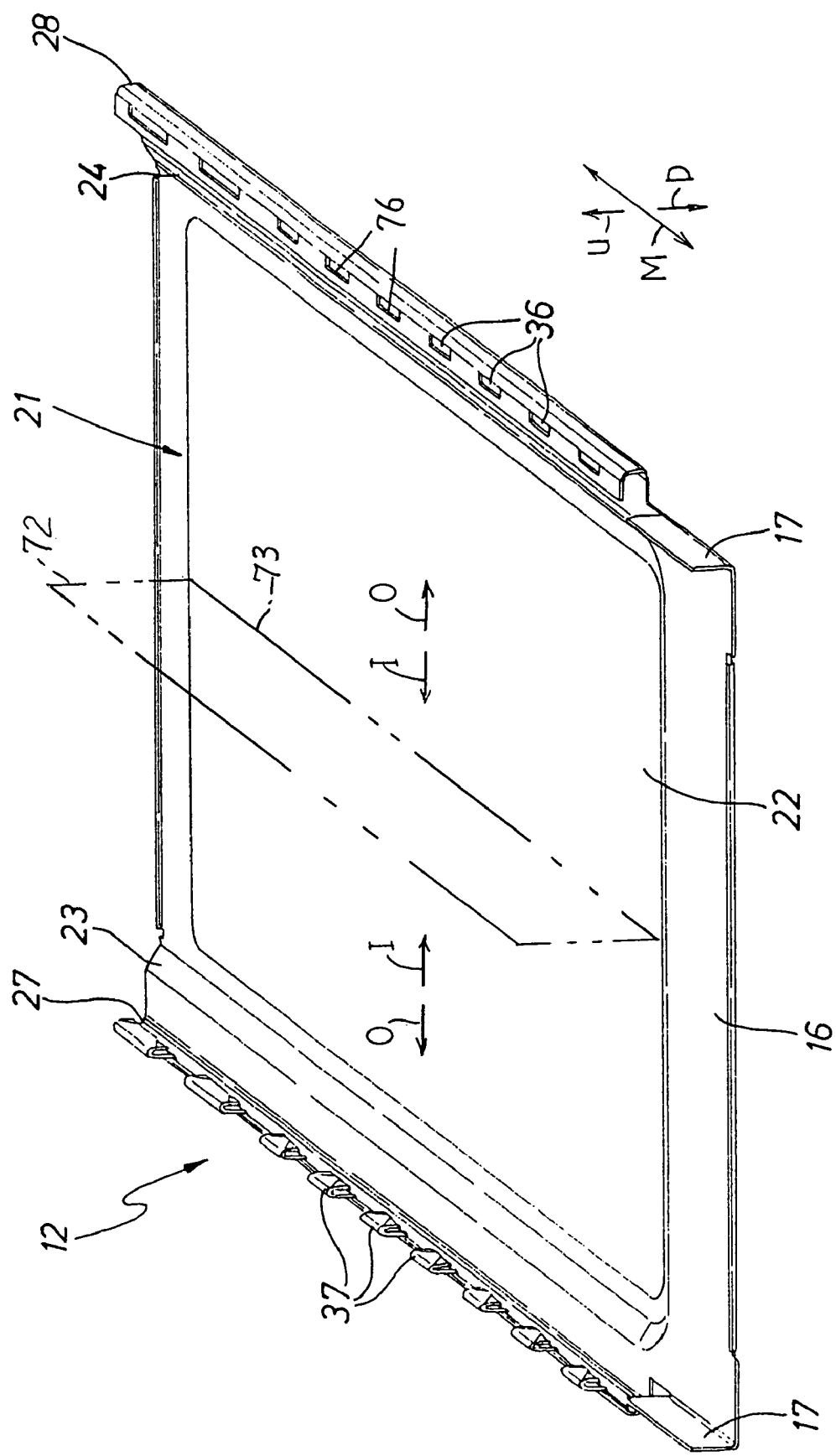
FIG. 2B is a bottom isometric view of the cover part of FIG. 2A.

FIG. 2B shows the bottom cover part 12, showing that one side 27 forms a plurality of lugs 37 that are longitudinally M spaced along the side. The opposite side 28 forms a plurality of holes, or elongated slots that are also longitudinally spaced along the corresponding side region and that lead to recesses 36. FIG. 2B shows a vertical plane 72 lying halfway between the laterally opposite sides 27, 28 and passing through a line 73 that forms a lateral middle. At each side, directions I and O define directions respectively toward and away from the vertical center plane 72. Nine lugs 37 and nine recesses 30 are shown at each side; a minimum of three lugs and recesses are required at each side.

Figure 3:
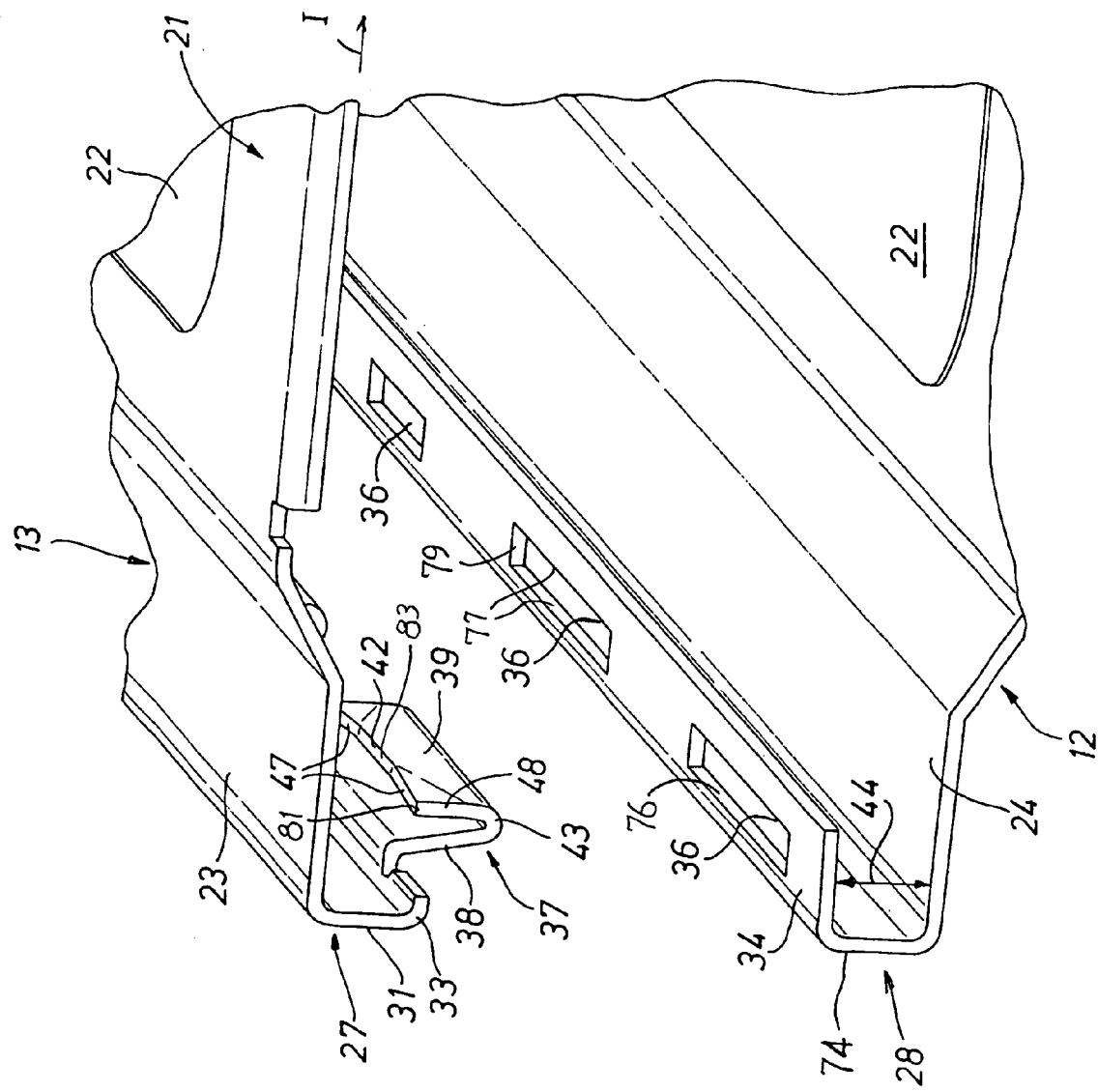
FIG. 3 is an exploded isometric view of a portion of the cover of FIG. 1, showing the two cover parts separated.

FIG. 3 shows a first side 27 of the top cover part and a first side 28 of the lower cover part. The top side 27 includes a horizontal top wall at region 23, a primarily vertical side wall 31, and a primarily horizontal middle lug wall 33. The middle lug wall 33 extends parallel to the horizontal top wall at 23. Each lug 37 has outer and inner legs 38, 39 and a bend or fold 43 that connects the legs. Each recess 36 in the lower cover part is formed between a horizontal bottom wall at 24, a partially vertical sidewall 74 and a primarily horizontal slot middle wall 34 that extends inward I from the top of the sidewall 74. The slot wall 34 has a plurality of holes in the form of longitudinally M elongated slots 76 that are longitudinally spaced apart. Each slot is rectangular and has long longitudinally-extending parallel opposite sides 77 and shorter ends 79.

Figure 4:
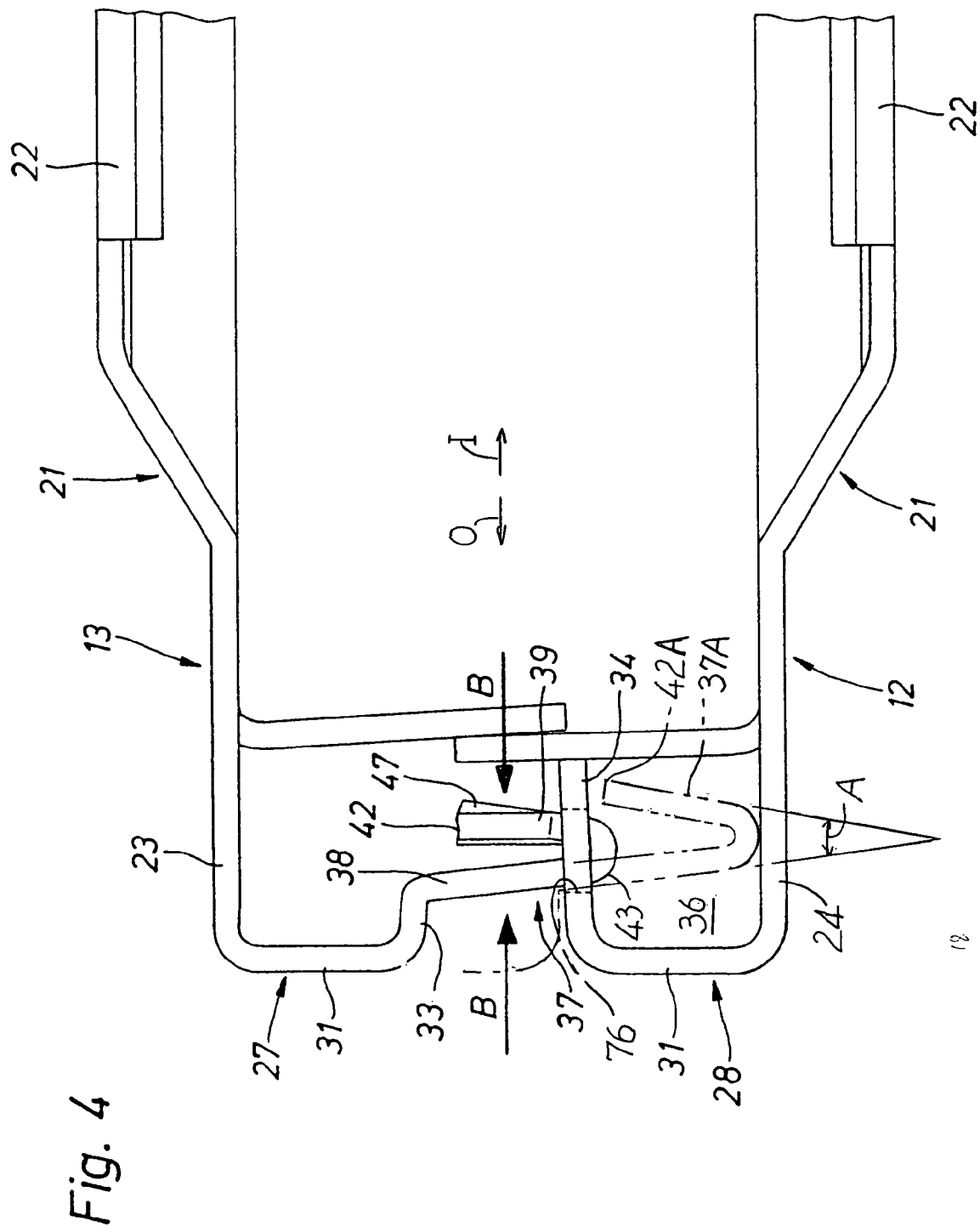
FIG. 4 is a partial sectional view of the cover parts of FIG. 3, with solid lines showing the cover parts approaching a fully connected configuration, and with phantom lines showing the cover parts in the fully connected configuration.
Figure 5:
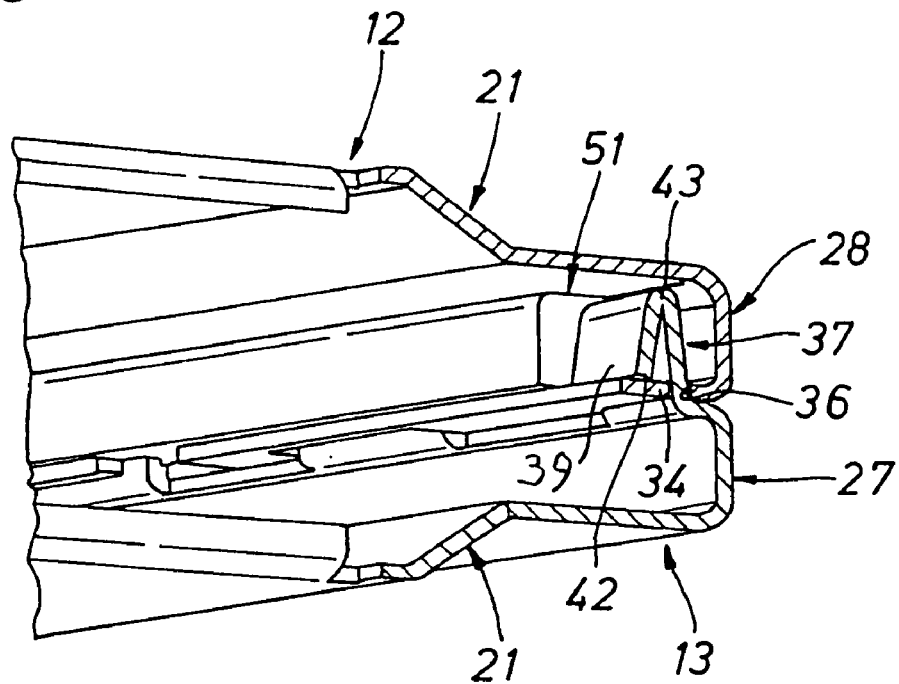
FIG. 5 is a partially sectional isometric view of one side of the fully connected cover parts, showing the side opposite that of FIG. 4, and also showing a retaining strip.

Each recess 36 is positioned to receive a corresponding lug 37, by the lug moving down so its fold 43 and then its legs 38, 39 pass through the slot 76 and into the recess (or the walls of the slot 76 can be said to move up around the lug). FIG. 4 shows, in solid lines, a lug 37 as it is being installed through a slot 76 and into a recess 36. FIG. 4 also shows, in phantom lines, the fully installed lug at 37A. The fold 43 initially holds the legs so they extend at an angle A about 20°. As the lug is pushed down through the slot 76, the legs deflect closer together, so their separation at the free end 42 of the inner leg 39 is about one half its original separation. When the lug is pushed down sufficiently, the free end 42 snaps away from leg 38. The free end 42 of the inner leg thereafter prevents separation of the cover parts 12, 13, because the inner leg free end at 42A will abut the horizontal slot middle wall 34 if the lug is lifted. In the particular electronic card illustrated in to FIG. 4, where the height of the card between bases 22 is 5 mm, the inner leg free end at 42A permits the top cover part to move up by only about 0.2 mm. This is no more than 8% of the card maximum thickness, so the middle walls 33, 34 substantially abut one another. When the top cover part 13 has been pushed down, middle lug wall 33 substantially abuts middle slot wall 34. FIG. 5 shows a side of an electronic card opposite the side shown in FIG. 4, in a variation, wherein a plastic retainer strip 51 has been installed along the recesses, to stabilize the lugs. The strip has portions that lie over the folds of the lugs.

FIG. 3 shows that the inner leg 39 of the lug has a pair of longitudinally opposite end corner portions 47 that are each bent so their longitudinally opposite free upper corners 81 lie closer to the outer leg than does the longitudinal middle 83 of the free upper end. The bent corner portions form chamfers that more easily pass through the slots.

Figure 6A:
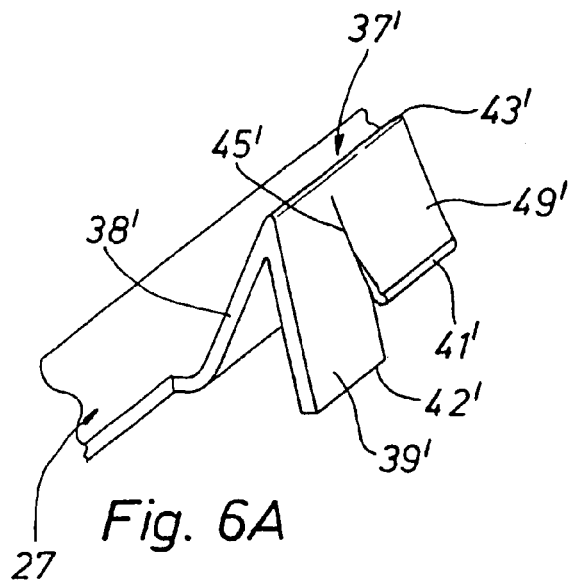
FIG. 6A is a partial isometric view of a lug of another embodiment of the invention.
Figure 6B:
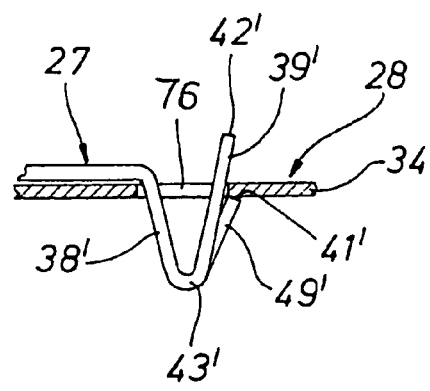
FIG. 6B is a sectional view of the lug of FIG. 6A, shown upside-down and installed on a slot wall of an opposite cover part.

FIG. 6A shows another construction of a lug 37', in which the lug has outer and inner legs 38' and 39' joined by a fold 43'. The inner leg is divided by a slit 45' into two tines 42' and 49', the shorter tine bent at a slightly greater acute angle from the outer leg. FIG. 6B shows the lug after it has been fully installed through a slot in the middle slot wall 34. The longer tine 42' projects upward through the slot 76, but the free tip 41' of the shorter tine 49' abuts the middle wall 34. This construction has the advantage that it positions the free tip 41' of the shorter tine 49' only slightly inward of the slot side.

Figure 7A:
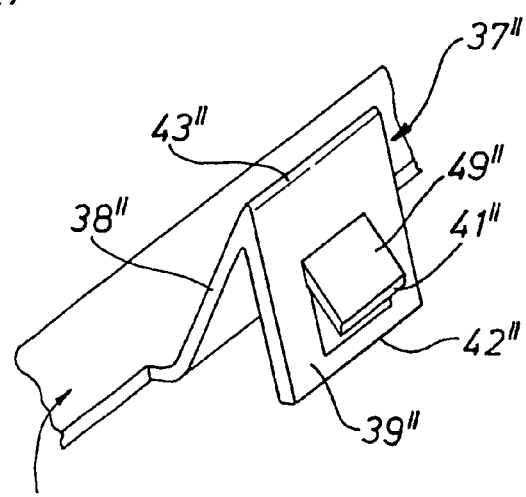
FIG. 7A is a partial isometric view of a lug of another embodiment of the invention.
Figure 7B:
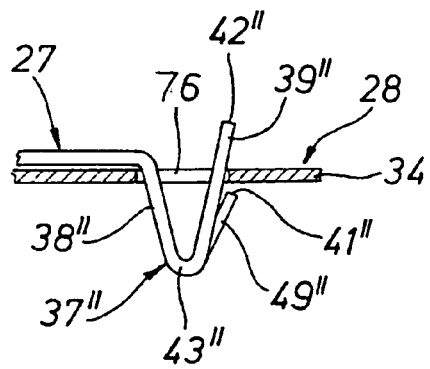
FIG. 7B is a sectional view of the lug of FIG. 7A, shown upside down and installed in a slot wall of an opposite cover part.

FIG. 7A illustrates a lug 37" with outer and inner legs 38" and 39" joined by a fold 43", in which a tine 49" with a free end 41" opposite the fold is formed by a slit in the inner leg. FIG. 7B shows the lug fully installed through a hole 76 in the middle wall 34, with the free end 41" lying closely under the middle wall.

Figure 8A:
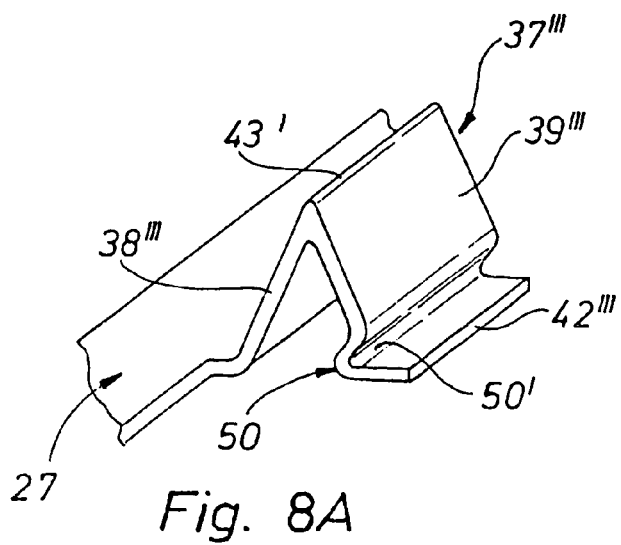
FIG. 8A is a partial isometric view of a lug of another embodiment of the invention.
Figure 8B:
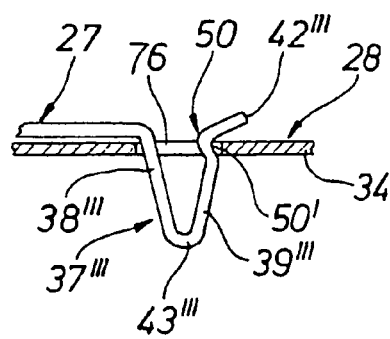
FIG. 8B is a sectional view of the lug of FIG. 8A, shown upside down and installed in a slot wall of the opposite cover part.

FIG. 8A illustrates another lug 37''' with outer and inner legs 38''', 39''' joined by a fold 43''', in which the inner leg has a double fold 50 forming a groove 50'. The groove extends outwardly from an inner face of the inner leg 39'''. FIG. 8B shows the lug 37''' fully installed on the middle wall, with the inwardly-opening groove 50' receiving an edge of the metal wall hole 76. This construction allows the lug to be forcefully pulled up out of the slot 76.

Figure 10:
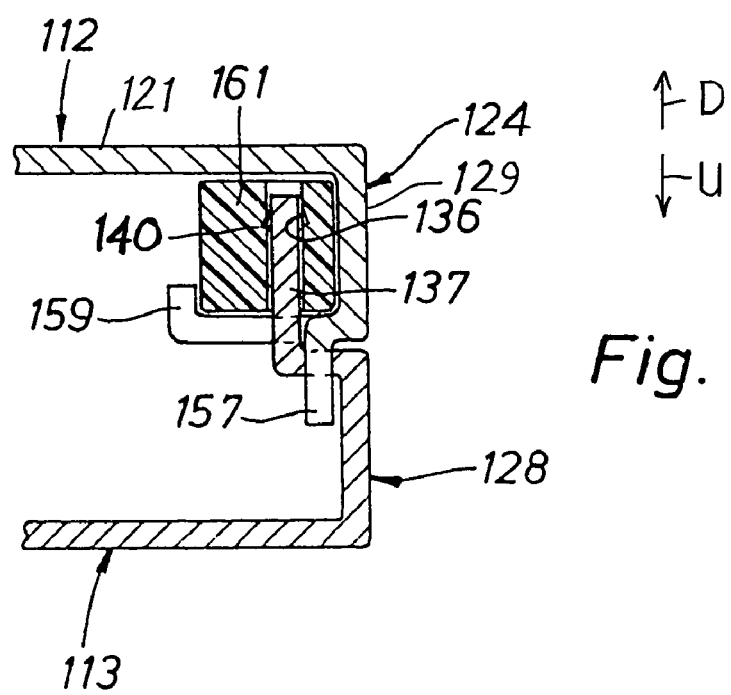
FIG. 10 is a partial sectional view of one side of fully connected cover parts of another embodiment of the invention.
Figure 9:
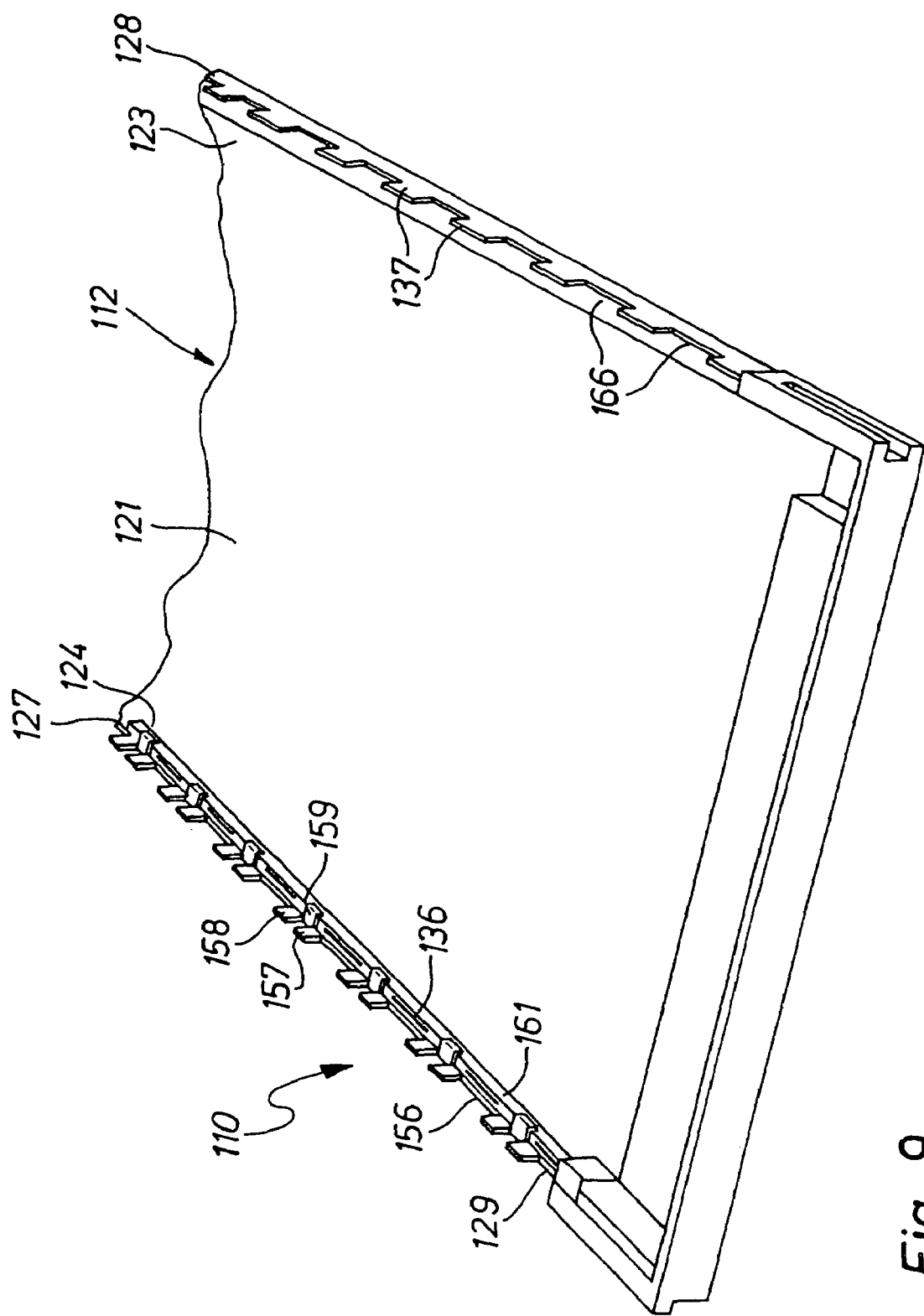
FIG. 9 is a partial isometric view of a cover part of another embodiment of invention.

FIG. 9 illustrates a sheet metal cover part 112 of an electronic card 110, which has a side 128 forming a plurality of lugs 137 that are longitudinally spaced apart by intermediate spaces 166. The other side 127 forms a plurality of slots 136 for receiving the lugs 137 of an identical top cover part. The side 127 forms a plurality of retention tabs 159. FIG. 10 shows that a plastic strip 161 is trapped in the side 124, between the base 121, a side wall 129, and retention tabs 159. The retention tabs 159 preferably have their inner ends bent towards the base 121. The plastic strip 161 has a slot 136 that receives the lugs. The lugs are formed with retention parts that prevent it from being pulled down out of a slot 136. Such retention parts can be formed by barbs indicated at 140 that dig into the plastic walls of the slot 136.

While terms such as "top", "bottom", etc. have been used to describe the electronic card and the relative orientation of its parts as they are illustrated in the drawings, it should be understood that the electronic card can be used in any orientation with respect to the Earth.

Thus, the invention provides a sheet metal cover for an electronic card, that allows top and bottom sheet metal cover parts to be latched together by pressing their opposite sides firmly against each other. A first side of the top cover part forms a plurality of longitudinally-spaced latching lugs, and an adjacent first side of the bottom cover part forms a plurality of longitudinally-spaced slots that each leads to a recess for receiving a portion of a lug. In one series of embodiments of the invention, each lug has outer and inner legs joined by a fold forming a diversion angle that is no more than 90°. The inner leg can have a free edge part that snaps through the slot and thereafter prevents separation of the cover parts. The inner leg can form an inwardly-opening groove that receives an edge of the slot wall to resist separation of the cover parts. In another embodiment, the lugs have barbs or other retention features, and project into a slot of a plastic strip.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electronic card of the type that has a circuit board and a sheet metal cover that surrounds a majority of the circuit board, wherein the cover includes top and bottom sheet metal cover parts with bases that each lies primarily in a horizontal plane and has laterally opposite sides, each of said cover parts having a lateral middle lying inward of said major sides, laterally-spaced largely vertical opposite side walls and longitudinally-spaced opposite ends, wherein:

a first side of a first of said cover parts has a first sheet metal horizontal middle wall and a plurality of longitudinally-spaced lugs extending therefrom, each lug having inner and outer legs and a fold that joins them, one of said legs having a free end;

a first side of a second of said cover parts includes a second sheet metal horizontal middle wall that abuts said first middle wall, said middle slot wall having a plurality of slots, each slot having inner and outer slot sides and having a width between said slot sides which is chosen to receive one of said lugs only by deflecting the legs of the lug closer together, the free end of each lug that is received under the horizontal second slot wall being positioned to abut said sheet metal horizontal second wall when said front and second cover parts start, to separate to prevent such separation.

2. The electronic card described in claim 1 wherein:

said slots are each elongated in a longitudinal direction, and each of said legs has a greater longitudinal length than the average lateral distance between the legs;

each cover part vertical side wall has an inwardly extending first middle lug wall portion that form said lugs, said first and second middle walls substantially abutting each other when said lugs are fully installed in said slots;

each of said lugs comprises a portion of sheet metal having an extreme bottom forming a bend that results in said legs on either side of said bend, said bend forming said fold.

3. An electronic card that has a circuit board and a sheet metal cover that has top and bottom cover parts with side walls that are joined together and that surrounds a majority of the circuit board, wherein the cover includes top and bottom sheet metal cover parts with primarily horizontal bases that each lies primarily in a horizontal plane, and sheet metal middle walls that abut one another when said cover parts are brought together, wherein:

a middle wall of a first of said top cover part side walls forms a plurality of longitudinally-spaced latching lugs and a middle wall of a first of said bottom cover part side walls forms a plurality of longitudinally-spaced lug-receiving recesses that each receives a lug when the lug is moved down into the recesses, and that each is positioned to engage the lug to resist upward movement of the lug out of the recess;

each of said lugs comprises a sheet metal portion with a bend forming outer and inner legs with extreme ends joined by said bend, the outer and inner legs diverging at an angle of no more than 90° at said bend, and said inner leg having a free top end;

each of said recesses comprises a region under a recess wall that has a plurality of holes, each hole having a lateral width that allows said inner and outer legs to pass down through the hole only by deflecting the legs close together, until said inner leg free top end passes below the recess top wall and can spring away from the outer leg and lie under one of said sheet metal middle walls.

4. The electronic card described in claim 2 wherein:

said inner leg has a top with longitudinally opposite corner portions that are each bent toward said outer leg, whereby to more easily pass down through the hole.

* * * * *